United States Patent [19]

Sawada et al.

[11] Patent Number: 4,984,012
[45] Date of Patent: Jan. 8, 1991

[54] COLOR IMAGE COPYING APPARATUS

[75] Inventors: Akihiro Sawada, Nagoya; Hideo Yoshihara, Kasugai, both of Japan

[73] Assignee: Brother Kogyo Kabushiki Kaisha, Nagoya, Japan

[21] Appl. No.: 260,034

[22] Filed: Oct. 20, 1988

[30] Foreign Application Priority Data

Oct. 23, 1987 [JP] Japan ............................... 62-268680
Oct. 23, 1987 [JP] Japan ........................... 62-162974[U]

[51] Int. Cl.⁵ ............................................. G03B 27/32
[52] U.S. Cl. ........................................ 355/27; 355/43; 355/71
[58] Field of Search ................. 355/27, 37, 35, 71, 355/43, 44, 45

[56] References Cited

U.S. PATENT DOCUMENTS 4,359,280 11/1982 Krause .................................. 355/37
4,375,918 3/1983 Isono et al. ........................... 355/35
4,746,955 5/1988 Slayton et al. ....................... 355/35
4,794,425 12/1988 Sakai et al. ............................ 355/43
4,843,431 6/1989 Horiguchi et al. ................... 355/38

Primary Examiner—Michael L. Gellner
Assistant Examiner—Khanh Dang
Attorney, Agent, or Firm—Oliff & Berridge

[57] ABSTRACT

In a color image copying apparatus, a light-path change-over reflector is movable into and out of a light path extending from a light source to an exposing station where a color latent image is to be formed on a photosensitive recording medium according to color image information of an original image. When the change-over reflector is disposed in the light path, the light from the light source is oriented or shifted so as to display the color image information of the original on a monitoring screen. Filters are used for color correction. When monitoring the original image on the screen, the filters are moved away from the light path. Further, the filters can be superposed together for minute color control with respect to the photosensitive sheet.

18 Claims, 3 Drawing Sheets

COLOR IMAGE COPYING APPARATUS

BACKGROUND OF THE INVENTION

The present invention relates to a color image copying apparatus, and more particularly, to the copying apparatus capable of compatibly using an original, an intermediate mask member, and a positive color film as original image carrying member as well as using as an image projector.

Conventionally, there has been proposed a color image copying apparatus in which a color image of a positive color film or slide (e.g. a 35 mm slide) is projected on a monitoring screen by providing a reflector in a light path extending from the positive colo film to a color photosensitive recording medium so as to obtain a monitoring color image on the screen.

Figure 3:
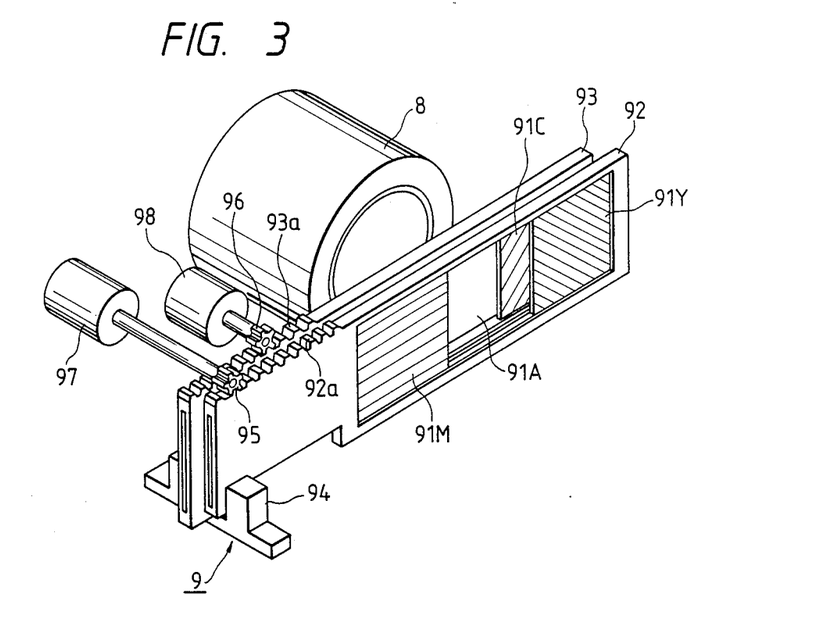
FIG. 3 is an enlarged, fragmentary perspective view showing a drive mechanism for moving chromatic resolution filters according to this invention.

Generally, a photosensitive recording medium generates color upon receipt of each of blue, green and red color lights, and it is common knowledge that the amount of exposure required is dependent on each of the colors. For example, in a photosensitive pressure-sensitive sheet of the type carrying color microcapsules, as shown in FIG. 3 of the accompanying drawings, large amount of exposure is required so as to render the microcapsules sensitive especially to red light. To this end, it has been proposed to provide a color light control filter in the light path extending from the light source to the photosensitive pressure-sensitive sheet for controlling the amount of light to be transmitted through the filter with respect to each of the color lights. Thus a particular color, e.g. red, can be exposed more than other colors in an attempt to make a color balance of a resultant color image on the photosensitive recording medium. Incidentally, the filter is disposed on the light path between the light source and the movable reflector in order to make the entire apparatus compact in size. To the contrary, assuming that the filter is disposed adjacent to the photosensitive recording medium, the filter should be necessarily large, thus making the whole apparatus large in size.

However, the above-mentioned apparatus has a problem that although the colors of the image formed on the photosensitive recording medium can be adequately well balanced by the filter, only a particular color of the image projected on the monitorinf screen would stand out clearly to degrade monitoring color balance. That is, the contents of the positive color film would be projeted on the screen with the color tone different from that of the original image due to the existance of the filter at the light path. Consequently it is impossible to monitor the actual image on positive color film in correct color tone, and hence the apparatus is difficult to use as a color transparency projector.

Further, in one conventional image recording apparatus of this kind, copying is carried out by using trichromatic resolution members, or with utilizing light directly reflected at an original or transmitted therethrough. In the former type, color correction filters are used in addition to basic red, green and blue filters. In order to obtain a final output color image having excellent color tone balance, various kinds of color correction filters must be prepared, and as a result, resultant copying apparatus becomes bulky and costly.

SUMMARY OF THE INVENTION

It is therefore an object of the present invention to provide a color image copying apparatus in which color tone of an positive color film can be indicated on a monitoring screen with high fidelity. Accordingly, this copying apparatus can also be used as a projector.

Another object of the invention is to provide a color image copying apparatus in which color correction can be achieved easily and accurately.

Still another object of the invention is to provide a color image copying apparatus which is small in size and hence inexpensive to manufacture.

To attain these objects, according to the invention there is provided a color images copying apparatus for forming an image on a photosensitive recording medium having sensitivities, the image corresponding to an original image of an original, the apparatus comprising: an exposure unit having an exposure stand along which the photosensitive recording medium is travelled; a light source; a projector lens for projecting light from the light source onto the photosensitive recording medium fed onto the exposure stand; a color light control filter unit movably disposed at a light path extending from the light source to the exposure stand, the color light control filter unit having a plurality of filters for selectively allowing specific light to pass therethrough in accordance with the sensitivity of the photosensitive recording medium; and, control means connected to the filter unit for moving at least one of the filters toward and away from the light path.

When a positive color film containing an original image is installed as the original at a position between the light source and the projector lens, this original image is projected at the photosensitive recording medium positioned at the exposure stand. In this case, color tone correction is carried out by setting at least one of the filters of the filter unit at the light path. Therefore, sufficient image is provided at the photosensitive sheet. On the other hand, when the color tone of the original image is intended to be acknowledged, the filters are moved away from the light path, so that an operator can acknowledge exact color tone of the original image without being affected by the filters.

According to another aspect of this invention, there is provided a color image copying apparatus for forming a latent image on a photosensitive recording medium, the image corresponding to an image of an original comprising; a light source; an exposure unit where the latent image is formed on the photosensitive recording medium; a pressure developing unit positioned on the downstream side of the exposure unit for developing the latent image; filter means having chromatic resolution filters disposed at a position between the light source and the exposure unit and movable toward and away from a light path extending from the light source to the exposure unit. The chromatic resolution filters comprise: a first filter unit having magenta filter, visible light transmissive filter, and a yellow filter arranged in this order, and a second filter unit having a magenta filter, a visible light transmissive filter and a cyan filter arranged in this order. The first and second filter units are juxtaposed with each other and relatively movable with each other, so that each one of the filters in the first filter unit is selectively superposed with each one of the filters in the second filter unit at the light path. That is, by the combinations of two filters among cyan, magenta and yellow filters, resultant filters can be red, green and blue filters. As a result, optimum color tone control is achievable by the combination of filters. Further, by partially utilizing these filters, spectroscopic characteristic of the light passing through the filter can be changed, to thereby conduct color tone control without using other independent color tone filters.

Many other advantages, features and additional objects of the present invention will become manifest to those versed in the art upon making reference to the detailed description and the accompanying drawings in which a structural embodiment incorporating the principles of the present invention are shown by way of illustrative example.

DETAILED DESCRIPTION OF THE INVENTION

Figure 1:
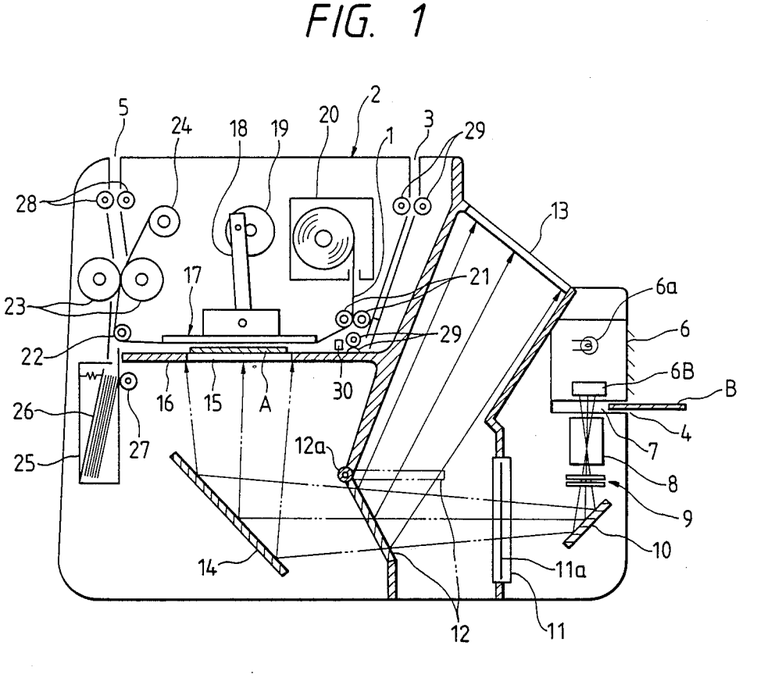
FIG. 1 is a vertical cross-sectional view showing a color image copying apparatus according to the present invention.

A color copuing apparatus according to this invention is shown in FIG. 1.

In the illustrated embodiment, a color photosensitive pressure-sensitive sheet disclosed in U.S. Pat. No. 4,399,209 is used as a photosensitive recording medium. This U.S. Patent generally discloses a transfer-type image recording medium wherein a developer material is coated on a separate substrate as a separate developer or copy sheet. That is, the transfer type recording medium comprises first and second image recording mediums. The first image recording medium comprises a photosensitive recording medium provided with microcapsules, and the microcapsules encapsulate therein a first material having first and second phases dependent on light exposure. The second image recording medium comprises the developer medium provided with a second material (developer material) which provides an output image upon reaction with the first material.

Figure 2:
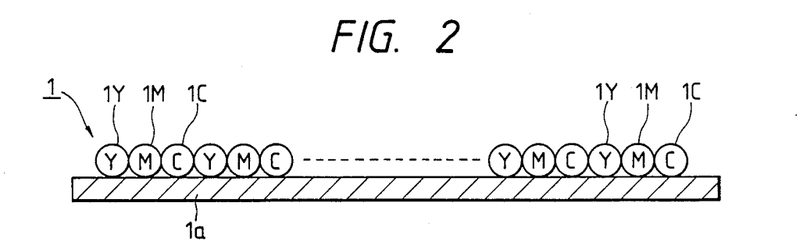
FIG. 2 is an enlarged, fragmentary cross-sectional view showing a photosensitive recording medium used in the apparatus of FIG. 1.

This color photosensitive pressure-sensitive recording sheet generally designated by 1 is schematically illustrated in FIG. 2. In the photosensitive pressure-sensitive recording sheet 1, cyan microcapsules 1C, magenta microcapsules 1M and yellow microcapcules 1Y are coated on one surface of a substrate 1a uniformly in mixed and dispersed state. Each of the cyan microcapsules 1C mainly contains a cyan chromogenic material together with a photocurable resin, a photosensitizer, a photopolymerization initiator, etc. Each of the magenta microcapsules 1M mainly contains a magenta chromogenic material, and each of the yellow microcapsules 1Y mainly contains a yellow chromogenic material.

In case a photosensitive recording medium other than that discussed above is used, a minor modification may be effected to a fixing device, while an exposure device can be used without any change. Such other type image recording medium may be a self-contained type image recording medium disclosed in U.S. Pat. No. 4,440,846 wherein an encapsulated chromogenic material or dye precurser and a developer material are co-deposited on one surface of a single substrate as one layer or two contiguous layers.

According to the image recording apparatus, the original may be one of a light transmissive original plate A on which an original image is provided, an intermediate recording medium (mask member) on which a mask image is formed at a suitable printer, and a positive color film B. For the exposure, the original plate A or the mask member is mounted at an exposure stand 16, whereas the positive color film B is installed at a position away form the exposure stand 16.

As shown in FIG. 1, the apparatus has a housing 2, an insertion port 3 from which an original A or a mask member (not shown) is inserted in the apparatus, another insertion port 4 for receiving the positive color film or slide B (e.g. a 35 mm positive color film) to be copied and/or projected, and a discharge port 5 from which a developer medium (second recording medium) having a copied image is to be discharged out of the apparatus. The apparatus also has a light source unit 6 composed of a halogen lamp 6a and a condenser lens 6b. In a light path extending downwardly from the light source unit 6, a positive film holder 7 is disposed immediately below the light source unit 6 for holding the positive color film B by a baising force of a leaf spring (not shown). Disposed below the positive film holder 7 is a projector lens 8 whose iris is controllable by a motor (not shown). A chromatic resolution filter unit 9 is disposed below the projector lens 8 for a purpose described below.

Figure 6A:
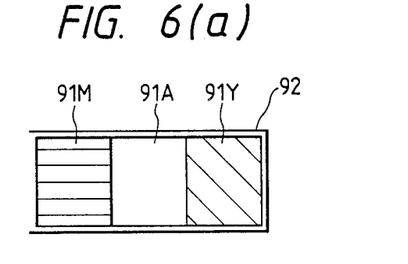
FIGS. 6(a) and 6(b) respectively illustrates first and second frames for securing chromatic resolution filters.
Figure 6B:
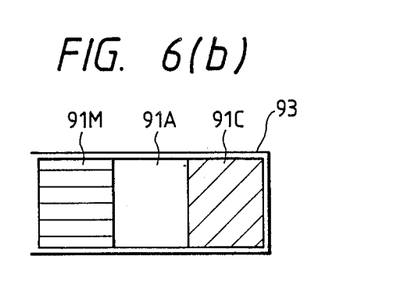
Figure 7:
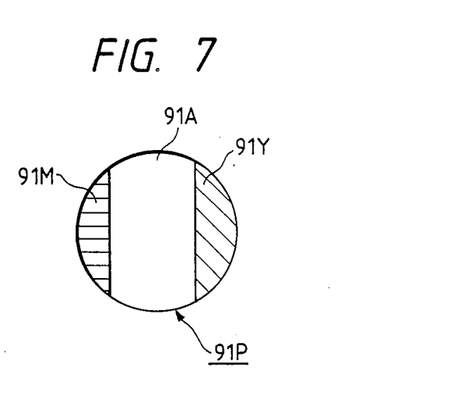
FIG. 7 illustrates the manner in which a color tone correction is effected.

As shown in FIGS. 3, 6(a) and 6(b), the chromatic resolution filter unit 9 includes a first filter frame 92, and a second filter frame 93. In the first filter frame 92, a magenta filter 91M, a visible-light transmissive portion 91A and a yellow filter 91Y are arranged in this order, as shown in FIG. 6(a). In the second filter frame 93, another magenta filter 91M, another visible-light transmissive portion 91A and a cyan filter 91C are arranged in this order, as shown in FIG. 6(b). The cyan filter 91C is transmissive of only light of a specified wavelength (650 nm in the illustrated embodiment) which photocures the cyan microcapsules 1C on the photosensitive pressure recording sheet 1 in accordance with a spectral sensitivity of the cyan microcapsules 1M. That is, the cyan filter 91C allows blue and green lights to pass therethrough. The magenta filter 91M is transmissive of only light of a specified wavelength (550 nm) which causes the magenta microcapsules 1M to cure in accordance with a spectral sensitivity of the magenta microcapsules 1M. The magenta filter 91M allows blue and red lights to pass therethrough. The yellow filter 91Y is transmissive of only light of a specified wavelength (450 nm) which causes the yellow microcapsules 1Y to cure in accordance with a spectral sensitivity of the yellow microcapsules 1Y. The yellow filter 91Y allows green and red lights to pass therethrough. The visible-light transmissive portion 91A allows visible light (350–780 nm) to pass therethrough to photo-cure the individual microcapsules 1C, 1M, 1Y.

As shown in FIG. 3, a photointerrupter 94 is provided to detect each position of the first and second filter frames 92, 93. The first filter frame 92 has a first integral rack 92a meshing with a first pinion 95 mounted on the driving shaft of a first pulse motor 97. Likewise, the second filter frame 93 has a second integral rack 93a meshing with a second pinion 96 mounted on the driving shaft of a second pulse motor 98. By rotating each of the first and second pulse motors 97, 98, the corresponding one of the first and second filter frames 92, 93 can be moved to a specified position as desired.

As shown in FIG. 1, a first reflector 10 is disposed below the filer unit 9 for orienting the vertical light path from the light source 6a substantially toward an exposure station in a horizontal direction. In this horizontal light path, a shutter 11 is disposed for regulating the amount of exposure to the photosensitive pressure-sensitive sheet by varying the time of opening of a shutter blade 11a by means of a drive motor (not shown). While the shutter 11 is closed, the light from the light source unit 6 does not reach the photosensitive pressure-sensitive sheet 1 as a photo-sensitive recording medium. To the contrary, while the shutter 11 is open, the light from the light source unit 6 reaches the photosensitive pressure-sensitive sheet 1 via a second reflector 14 for orienting the horizontal light path then in an upward direction.

Between the shutter 11 and the second reflector 14 in the horizontal light path a light-path change-over reflector 12 is disposed. The light-path change-over reflector 12 is pivotally supported to the housing 2 by a pivot shaft 12a and pivotally movable between a first or upper position (dash-and-two-dot lines) in which the light from the first reflector 10 is allowed to reach the second reflector 14, and a second or lower position (solid lines) in which the light from the first reflector 10 is prevented from reaching the second reflector 14 and is reflected to reach a monitoring screen 13. A focus adjusting button (not shown) is provided for focussing the image on the positive film on the screen 13. Further, a microswitch (not shown) is provided to detect the position of the change-over reflector 12. The change-over reflector 12 is moved from the second position to the first position as driven by a suitable drive means (not shown), only when the photosensitive pressure-sensitive sheet 1 is to be exposed to light through the original A in intimate contact therewith or through the positive color film B positioned at the insertion port 4.

Upwardly of the second reflector 14, the exposure stand 16 is disposed on which the original A supplied from the port 3 is supportable. A pressure plate 17 is mounted on a lower end of a vertical rod 18, and a drive gear 19 is coupled to another end of the vertical rod 18. The pressure plate 17 is movable downwardly for pressingly interposing the photosensitive pressure-sensitive sheet 1 on the exposure stand 16 between the plate 17 and the original A.

The photosensitive pressure-sensitive sheet 1 can be drawn, by a pair of feed rollers 21, 21 and by a driving roller 22, from a sheet roll cassette 20. The photosensitive pressure-sensitive sheet 1 extends around the driving roller 22 and between a pair of pressure fixing rollers 23, 23 and finally leads to a take-up reel 24.

Designated by 25 is a sheet cartridge for storing a stack of developer sheets 26. A delivery roller 27 is mounted on the sheet cartridge 25 for picking one of the developer sheets 26 from the sheet cartridge 25. After the transferring and developing, the developer sheet 26 is discharged out of the apparatus from the discharge port 5 by a pair of discharge rollers 28, 28.

Under the insertion port 3 a pair of conveyor rollers 29, 29 are disposed for conveying the individual intermediate recording medium (mask member) to an exposing station where the light from the light source unit 6 is applied over the photosensitive pressure-sensitive sheet through the mask member.

Figure 4:
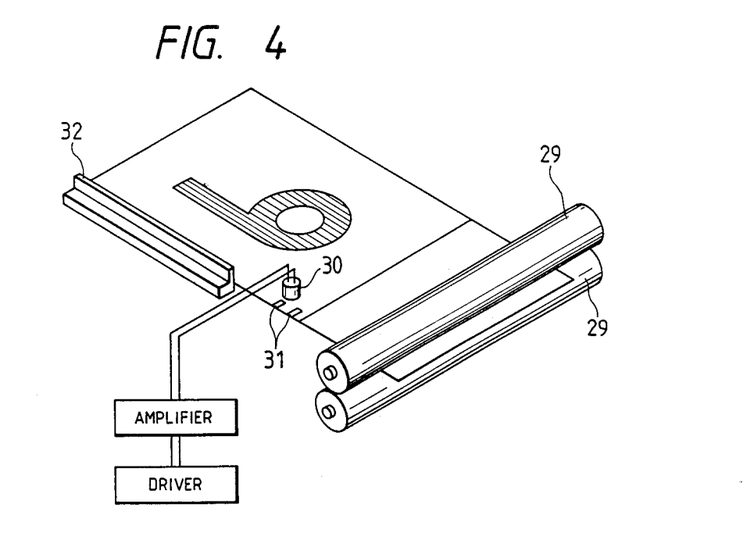
FIG. 4 is a schematic perspective view showing a mechanism for registering a intermediate recording medium (mask member) in its original reference position according to this invention.

FIG. 4 illustrates a mechanism for registering the leading end of the mask in its original reference position. The mechanism includes a sensor 30 for reading out a par of location marks 31, 31 printed on a marginal portion of the mask member. Reference numeral 32 designated a guide along which one side edge of the mask member is in slide contact. The sensor 30 is connected to an amplifier and a driver as shown. With this location mechanism, each of the three mask members corresponding to red, blue and green colors can be registered exactly in the identical position.

The apparatus is operable in three different modes:

COPYING MODE USING INTERMEDIATE RECORDING MEDIUM

First of all, a method of forming a mask image on the intermediate recording medium (mask member) is described. An image information of each of red, green and blue colors inputted by an image scanner (not shown) is recorded with a single color on a recording medium such as for example, a thermal sensitive sheet or OHP sheet. Thus three mask members corresponding to three primary colors are obtained, and they are used as the intermediate recording mediums.

The copying mode for using the intermediate recording medium is selected by an operation panel (not shown), and the mask member on which red color image information is recorded is inserted in the insertion port 3. As the first and second filter frames 92, 93 are moved respectively by the first and second pulse motors 97, 98, the yellow filter 91Y and the magenta filter 91M are selectively arranged in the light path. By detecting the feed amount of the mask member by means of the location sensor 30 as the mask member is fed along the guide 32 by the feed rollers 29, 29, the mask member is located at a specified position in the exposing station. Then the drive gear 19 is rotated to lower the pressure plate 17 so that the photosensitive pressure-sensitive sheet 1 and the mask member are pressed against an original support stand or glass 15. Subsequently the light-path change-over reflector12 is moved upwardly to the first position as driven by the non-illustrated motor.

Then, when the halogen lamp 6a is lighted, the light from the lamp 6a reaches the exposing station via the condenser lens 6b, the projector lens 8, the magenta filter 91M, the cyan filter 91C, the first reflector 10, the shutter 11 and the second reflector 14. At that time only the light of a specified wavelength (650 nm) causing only the cyan microcapsules 1C to cure, is transmitted through the cyan filter 91C. On the photosensitive pressure-sensitive sheet 1, cured are the cyan microcapsules 1C only at the areas corresponding to the specific mask member region through which the light is transmissive. As a result, a latent image can be formed on the photosensitive pressure-sensitive sheet 1. Thereafter the shutter 11 is closed, the pressure plate 17 is moved upwardly, and only the mask member is discharged out of the apparatus, while the photosensitive sheet 1 is stationarily maintained.

Using the mask member having green image information and the mask member having blue image information, the first and second filter frames 92, 93 are controlled in such a manner that only green and blue lights can transmit through the filters to selectively expose the respective color microcapsules, thereby forming a latent image at the identical portion on the sheet 1. Then the photosensitive pressure-sensitive sheet 1 is moved toward the pressure fixing rollers 23 by the feed rollers 21, 21 and the take-up reel 24. When the exposed areas (latent image areas) on the photosensitive pressure-sensitive sheet 1 arrives at the pressure fixing rollers 23, 23 via the driving roller 22, a developer sheet 26 from the sheet cartridge 25 is placed on the photo-sensitive pressure-sensitive sheet 1 over the exposed areas thereof and is pressed against the sheet 1 by the pressure fixing rollers 23, 23. As a result, the image is transferred and developed. Subsequently the used portion of the photosensitive pressure-sensitive sheet 1 is further wound over the take-up reel 24, while the thus developed developer sheet 26 is discharged out of the apparatus through the discharge port 5.

COPYING MODE USING ORIGINAL PLATE A

For the mode of copying a transparent original A, the original A is set in the insertion port 3, and a copying switch (not shown) is turned ON. The original is fed to a specified position in the exposing station by the conveyor rollers 29, 29. At that time, unlike the case of feeding the mask members, it is unnecessary to detect the position of the original A by the location sensor 30. When the drive gear 19 is rotated, the pressure plate 17 is lowered to bring the photosensitive pressure-sensitive sheet 1 in contact with the original A. In the meantime the shutter 11 is initially temporarily closed, and then the light-path change-over reflector 12 is moved upwardly to the first position, and thereafter the shutter 11 is opened so that the photosensitive pressure-sensitive sheet 1 is exposed to the light from the light source unit 6 through the original A. In this copying mode, since large light amount is required for irradiating the original, iris of the projector lens 8 is fully opened. The shutter 11 is closed again to finalize the exposure. Now as the change-over reflector 12 is moved downwardly to the second position, the shutter 11 is reopened.

The latent image of the photosensitive pressure-sensitive sheet 1 is transferred and developed in the manner the same as in the above-discussed copying mode using the mask member.

COPYING MODE USING POSITIVE COLOR FILM

For the mode of copying the positive color film B, the positive color film B is inserted in the insertion port 4, and the photosensitive pressure-sensitive sheet 1 is exposed to the light through the projector lens 8. Thus a latent image is formed on the photosensitive pressure-sensitive sheet 1. The latent image of the photosensitive pressure-sensitive sheet 1 is developed in the manner the same as in the above-discussed copying mode using the mask member. More specifically, upon depression of the copying switch (not shown), the pulse motors 97 and 98 are energized, so that the frames 92 and 93 are moved in response to the photosensitivity of the photosensitive pressure sensitive sheet 1 which sensitivity is inputted at the switch panel (not shown). Therefore, the color tone filters are brought to a position on the light path bridging between the light source unit 6 and the first reflector 10. For example, if the red light is intended to be extensively irradiated rather than the other lights, the magenta filter 91M on the second frame 93 and the yellow filter 91Y on the first frame 92 are positioned at the light path.

Further, at the same time, the shutter blade 11a of the shutter unit 11 is closed, and the drive gear 18 is rotated so as to descend the pressure plate 17, whereby the photosensitive pressure sensitive sheet 1 and the original support stand 16 are in close contact with each other, to thereby obtain proper position of the sheet 1. In this case, the change-over reflector 12 is pivotted to the first position (upward position) to allow light to direct toward the second reflector 14.

Then, the shutter blade 11a is opened by a predetermined time for exposure, during which the image information contained in the positive film B is projected onto the photosensitive pressure sensitive sheet 1 through the projector lens 8, the filters 9, the first reflector 10, and the second reflector 14. Upon closure of the shutter unit 11, the light-path change-over reflector 12 is moved toward the second position (lower position), and then the filters 9 are moved away from the light path by the actuation of the pulse motors 97, 99, and the shutter 11 is again opened. Accordingly, the image information on the positive film B is projected onto the monitoring screen 13. In the meantime, the pressure plate 17 is moved to its ascent position to release the sheet 1. Subsequent operation is the same as that in the foregoing copying mode, and therefore, further description is negligible.

Figure 5:
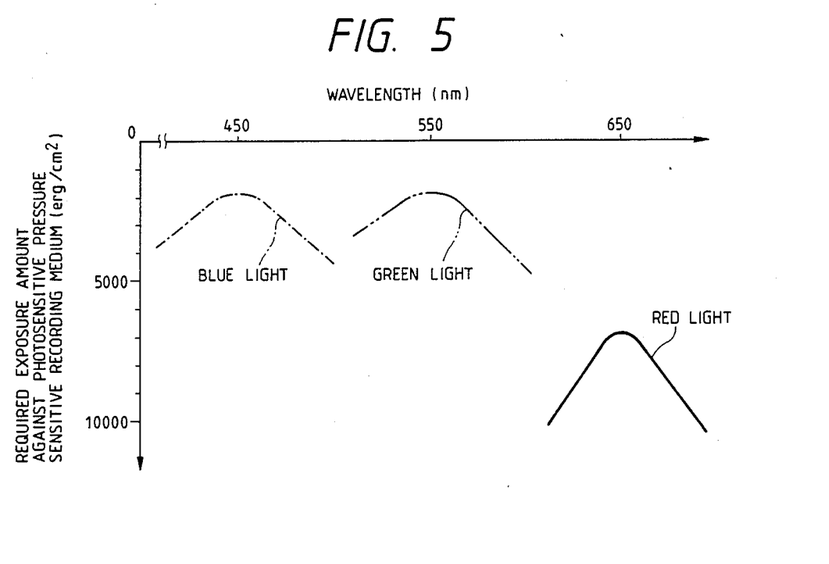
FIG. 5 is a graph illustrating the relationship between a required amount of exposure and wavelength with respect to each color of a photosensitive recording medium.

In case of employment of the original or the positive color film, it is unnecessary to use the chromatic resolution filter. If the individual microcapsules of the photosensitive pressure-sensitive sheet 1 have sensitivities different from one another, the chromatic resolution filter may be used as a color correction filter so that a copy image having a well balance in color tone can be achieved. For example, if the photosensitive pressure-sensitive sheet 1 has the sensitivity characteristic as shown in FIG. 5, the cyan microcapsules 1C curable to red light may not be easily photo-cured, compared to the magenta and yellow microcapsules 1M, 1Y, provided that the same amount of exposure is applied. In such event, it is possible to make an exposure with somewhat reddish white light by slightly inserting both the yellow filter 91Y and the magenta filter 91M into a light passageway 91P defined by the projector lens 8. Thus by utilizing one or two of the chromatic resolution filters for color correction purpose, well-balanced or uniform exposing can be achieved, irrespective of the characteristic of the photosensitive pressure-sensitive sheet.

MODE FOR MONITORING COLOR IMAGE ON POSITIVE FILM

When a power switch of the apparatus is turned ON, the color correction filter 9 is moved to its original reference position. At that time, the pulse motors 97, 98 are rotated to position the visible-light transmissive filter 91A at the light path which extends from the light source unit 6 to the first reflector 10 in response to the detection by the photointerrupter 94. Concurrently, the microswitch (not shown) detects whether the light-path change-over reflector 12 is disposed in the second position (solid-line position in FIG. 1) or not. If the change-over reflector 12 is not at the second position, it is turned toward the second position about the pivot shaft 12a. When the reflector 12 is thus moved to the second position, the shutter blade 11a of the shutter 11 is opened by the motor (not shown). At that time, the light from the light source unit 6 reaches the monitoring screen 13 via the projector lens 8, the visible-light transmissive portion 91A, the first reflector 10, the shutter 11 and the change-over reflector 12. As a result, the image on the screen 13 is not affected by the filters 91M 91Y 91C, so that exact color on the positive film B can be recognized by the operator, and the apparatus can be applied as a projector device.

The positive color film B inserted in the insertion port 4 is secured to the slide holder 7. Then when the focus adjusting button (not shown) is depressed, the positive color film B is projected on the monitoring screen 13, and the position of the projector lens 8 is subjected to adjustment for image focussing on the screen 13. At that time it is possible to reproduce the color tone of the positive color film B on the monitoring screen with high fidelity, since no substantial filter exists at the light path.

In the illustrated embodiment, since the distance between the monitoring screen 13 and the projector lens 8 is equal to the distance between the photosensitive pressure-sensitive sheet 1 and the projector lens 8, the focus on the photosensitive pressure-sensitive sheet 1 can be automatically adjusted upon adjustment of the focus on the monitoring screen 13.

COPYING MODE USING BOTH ORIGINAL PLATE A AND COLOR FILM B

By the similtaneous installation of the origial at the exposure station and the positive color film at the holder 7, composite latent image brought thereby is obtainable at the photosensitive pressure sensitive sheet 1.

In view of the foregoing, according to the present invention, the color tone control filters can provide suitable exposure so as to provide well-balanced color tone latent image on the photosensitive recording medium, and further, the color information of the positive color film is correctly displayed on the monitoring screen with high fidelity. Accordingly, original color image and its orientation is easily acknowledged by the operator, and as a result, the copying apparatus is also available as a color projector. Furthermore, according to the present invention, by suitably superposing at least two filters with each other selected from the group consisting of the cyan, magenta and yellow filters, these filters can be used as red, green and blue filters, and color correction is also achievable by the selected combination of the filters, to thereby minimize numbers of filters, to thus accomplish compact and low cost apparatus.

While the invention has been described in detail and with reference to specific embodiment thereof, it would be apparent for those skilled in the art that various changes and modifications can be made therein without departing from the spirit and scope of the invention.

What is claimed is:

1. A color image copying apparatus for forming an image on a photosensitive recording medium having sensitivities, said image corresponding to an original image of an original, comprising:
   an exposure unit having an exposure stand along which said photosensitive recording medium is travelled;
   a light source;
   a projector lens for projecting light from said light source onto said photosensitive recording medium fed onto said exposure stand;
   a color light control filter unit movably disposed at a light path extending from said light source to said exposure stand, said color light control filter unit having a plurality of filters for selectively allowing specific light to pass therethrough in accordance with said sensitivity of said photosensitive recording medium, said plurality of filters comprising a plurality of chromatic resolution filters movable independently and in combination in and out of said light path; and
   control means connected to said filter unit for moving at least one of said filters toward and away from said light path;
   wherein said original is at least one of a first original installable on said exposure stand, a second original on which a mask image is formed, and a third original comprising a positive color film, said color image forming apparaus further comprising positioning means for positioning said first original or said second original between said exposure stand and said photosensitive recording medium at said exposure unit and for positioning said third original between said light source and said projector lens.

2. The color image copying apparatus according to claim 1, wherein said photosensitive recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material, said image being a latent image formed on said first image recording medium at said exposure unit.

3. The color image copying apparatus according to claim 2, wherein said first image recording medium has cyan microcapsules each mainly containing a cyan chromogenic material, magenta microcapsules mainly containing a magenta chromogenic material, and yellow microcapsules mainly containing a yellow chromogenic material, and wherein said plurality of chromatic resolution filters comprises:
   at least one magenta filter transmissive of only light of a first specific wavelength corresponding to a spectral sensitivity of said magenta microcapsules;
   a cyan filter transmissive of only light of a second specific wavelength corresponding to a spectral sensitivity of said cyan microcapsules; and
   a yellow filter transmissive of only light of a third specific wavelength corresponding to a spectral sensitivity of said yellow microcapsules.

4. The color image copying apparatus according to claim 3, wherein said color light control filter unit further comprises a first filter frame and a second filter frame, said first filter frame having one of said magenta filters, a visible-light transmissive portion, and said yellow filter arranged in this order, said second filter frame having another magenta filter, another visible-light transmissive portion, and said cyan filter.

5. The color image copying apparatus according to claim 4, wherein said control means comprises first and second motors each having a driving shaft, first and second pinions each mounted on said driving shaft of the respective first and second motors, and first and second racks respectively integral with said first and second filter frames and respectively meshing with said first and second pinions.

6. The color image copying apparatus according to claim 1, further comprising;
   a first reflector positioned adjacent said filter unit;
   a second reflector positioned adjacent said exposure stand;
   a light path changing means disposed between said first and second reflectors, said light path changing means providing first and second positions; and,
   a monitoring screen for displaying thereon a color image information of said third original, a light from said light source being travelled toward said exposure stand through said third original, said first reflector and said second reflector when said light path changing means is at its first position and when at least one of said filters is at said light path for color tone control, and said light from said light source being travelled toward said monitoring screen through said third original and said first reflector when said light path changing means is at its second position and when all said filters are moved out of said light path.

7. The color image copying apparatus according to claim 6, wherein a light path length between said projector lens to said exposure stand via said first and second reflectors is equal to a light path length between said projector lens and said mointoring screen via said first reflector ans said light path changing means.

8. A color image copying apparatus for forming a latent image on a photosensitive recording medium, said image corresponding to an image of an original comprising:
   a light source;
   an exposure unit where said latent image is formed on said photosensitive recording medium;
   a pressure developing unit positioned on the downstream side of said exposure unit for developing said latent image;
   filter means having chromatic resolution filters disposed at a position between said light source and said exposure unit and movable toward and away from a light path extending from said light source to said exposure unit, said chromatic resolution filters comprising: a first filter unit having a magenta filter, a visible light transmissive filter, and a yellow filter arranged in this order; and a second filter unit having a magenta filter, a visible light transmissive filter and a cyan filter arranged in this order, said first and second filter units being juxtaposed with each other and relatively movable with each other, so that each one of filters in said first filter unit can be selectively superposed with each one of filters in said second filter unit at said light path for color tone control against said photosensitive recording medium and so that each one of the filters in said first filter unit and each one of the filters in said second filter unit can be laterally spacedly arranged in said light path.

9. The color image copying apparatus according to claim 8, wherein said photosensitive recording medium has cyan microcapsules each mainly containing to cyan chromogenic material, magenta microcapsules mainly containing a magenta chromogenic material, and yellow microcapsules mainly containing a yellow chromogenic material.

10. The color image copying apparatus according to claim 9, wherein said magenta filter is transmissive of only light of a first specific wavelength corresponding to a spectral sensitivity of said magenta microcapsules; and wherein said cyan filter is transmissive of only light of a second specific wavelength corresponding to a spectral sensitivity of said cyan microcapsules; and wherein said yellow filter is transmissive of only light of a third specific wavelength corresponding to a spectral sensitivity of said yellow filter.

11. A color image copying apparatus for forming an image on a photosensitive recording medium having sensitivities, said image corresponding to an original image of an original, comprising:
   an exposure unit having an exposure stand along which said photosensitive recording medium is travelled;
   a light source;
   a projector lens for projecting light from said light source onto said photosensitive recording medium fed onto said exposure stand;
   a color light control filter unit movably disposed at a light path extending from said light source to said exposure stand, said color light control filter unit having a plurality of filters for selectively allowing specific light to pass therethrough in accordance with said sensitivity of said photoconductive recording medium; and
   control means connected to said filter unit for moving at least one of said filters toward and away from said light path;
   wherein said original is at least one of a first original installable on said exposure stand, a second original on which a mask image is formed, and a third original comprising a positive color film, said color image forming apparatus further comprising positioning means for positioning said first original or said second original between said exposure stand and said photosensitive recording medium at said exposure unit and for positioning said third original between said light source and said projector lens.

12. The color image copying apparatus according to claim 11, wherein said photosensitive recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material, said image being a latent image formed on said first image recording medium at said exposure unit.

13. The color image copying apparatus according to claim 12, wherein said first image recording medium has cyan microcapsules each mainly containing a cyan chromogenic material, magenta microcapsules mainly containing a magenta chromogenic material, and yellow microcapsules mainly containing a yellow chromogenic material, and wherein said chromatic resolution filters comprises:
   at least one magenta filters transmissive of only light of a first specific wavelength corresponding to a spectral sensitivity of said magenta microcapsules;

a cyan filter transmissive of only light of a second specific wavelength corresponding to a spectral sensitivity of said cyan microcapsules; and a yellow filter transmissive of only light of a third specific wavelength corresponding to a spectral sensitivity of said yellow microcapsules.

14. The color image copying apparatus according to claim 11, further comprising:

a first reflector positioned adjacent said filter unit;

a second reflector positioned adjacent said exposure stand;

a light path changing means disposed between said first and second reflectors, said light path changing means providing first and second positions; and a monitoring screen for displaying thereon a color image information of said third original, a light from said light source being travelled toward said exposure stand through said third original, said first reflector and said second reflector when said light path changing means is at its first position and when at least one of said filters is at said light path for color tone control, and said light from said light source being travelled toward said monitoring screen through said third original and said first reflector when said light path changing means is at its second position and when all said filters are moved out of said light path.

15. The color image copying apparatus according to claim 14, wherein a light path length between said projector lens to said exposure stand via said first and second reflectors is equal to a light path length between said projector lens and said monitoring screen via said first reflector and said light path changing means.

16. The color image copying apparatus according to claim 13, wherein said color light control filters unit further comprises a first filter frame and a second filter frame, said first filter frame having one of said magenta filters, a visiblelight transmissive portion, and said yellow filter arranged in this order, said second filter frame having another magenta filter, and other visible-light transmissive portion, and said cyan filter.

17. The color image copying apparatus according to claim 16, wherein said control means comprises first and second motors each having a driving shaft, first and second pinions each mounted on said driving shaft of the respective first and second motors, and first and second racks respectively integral with said first and second filter frames and respectively meshing with said first and second pinions.

18. The color image copying apparatus according to claim 11, wherein said positioning means comprises a first positioning means for positioning the first original or the second original between the exposure stand and the photosensitive recording medium at said exposure unit and a second positioning means for simultaneously positioning the third original between the light source and the projector lens, whereby a composite latent image is formed on the photosensitive recording medium.

* * * * *